United States Patent
Ho et al.

(10) Patent No.: US 11,923,866 B2
(45) Date of Patent: Mar. 5, 2024

(54) DIGITAL-TO-ANALOG CONVERSION APPARATUS AND METHOD HAVING SIGNAL CALIBRATION MECHANISM

(71) Applicant: REALTEK SEMICONDUCTOR CORPORATION, Hsinchu (TW)

(72) Inventors: Hsuan-Ting Ho, Hsinchu (TW); Shih-Hsiung Huang, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 191 days.

(21) Appl. No.: 17/683,397

(22) Filed: Mar. 1, 2022

(65) Prior Publication Data
US 2022/0345139 A1 Oct. 27, 2022

(30) Foreign Application Priority Data
Apr. 23, 2021 (TW) ................. 110114807

(51) Int. Cl.
*H03M 1/10* (2006.01)
(52) U.S. Cl.
CPC ................. *H03M 1/1014* (2013.01)
(58) Field of Classification Search
CPC ............ H03M 1/12; H03M 1/70; H03M 1/00; H03M 3/388; H03M 3/504; H03M 3/50; H03M 3/508; H03M 7/304; H03M 7/3042; H03M 1/1061; H03M 1/1052; H03M 1/742; H03F 3/245; H03F 1/3247; H03F 1/3258; H03F 2200/294; H03F 2200/321; H03F 2200/451; H03F 3/195; H03F 3/2175; H03F 3/2176; H04B 1/04; H04B 1/0475; H04B 1/40; H04B 10/697; H04B 1/16; H04B 1/713; H04B 1/715; H04B 1/7156; H04B 10/2575; H04B 10/25752; H04B 10/40; H04B 10/5561; H04B 17/0085;
(Continued)

(56) References Cited

U.S. PATENT DOCUMENTS

| 5,995,030 A | * | 11/1999 | Cabler | ................. H03M 3/504 341/143 |
| 6,707,404 B1 | * | 3/2004 | Yilmaz | ................. H03M 1/1061 341/145 |

(Continued)

*Primary Examiner* — Linh V Nguyen
(74) *Attorney, Agent, or Firm* — WPAT, P.C

(57) ABSTRACT

The present invention discloses a DAC method having signal calibration mechanism is provided. Operation states of current sources are controlled to generate an output analog signal by a DAC circuit according to a codeword of an input digital signal. An echo signal is generated by an echo transmission circuit according to the output analog signal. The codeword is mapped to generate an offset signal by a calibration circuit according to a codeword offset mapping table. The offset signal is processed to generate an echo-canceling signal by an echo-canceling circuit. By a calibration parameter calculation circuit, offset amounts are generated according to a difference between the echo signal and the echo-canceling signal, the offset amounts are grouped to perform statistic operation according to the operation states and current offset values are calculated according to calculation among groups and converted to codeword offset values to update the codeword offset mapping table.

12 Claims, 5 Drawing Sheets

(58) Field of Classification Search
CPC .............................. H04B 17/14; H04B 17/21; H04B 2001/0425; H04B 2001/0491; H04B 3/232; H04B 3/234; H04B 3/32; H04B 7/15585
USPC ................................. 341/110, 118–120, 144
See application file for complete search history.

(56) References Cited

U.S. PATENT DOCUMENTS

| | | | | |
|---|---|---|---|---|
| 6,744,757 | B1* | 6/2004 | Anandakumar | H04L 45/00 370/465 |
| 6,965,262 | B2* | 11/2005 | Zerbe | H03K 17/162 327/51 |
| 9,621,177 | B1* | 4/2017 | Jun | H03M 1/1033 |
| 2004/0252700 | A1* | 12/2004 | Anandakumar | H04L 65/65 370/395.21 |
| 2006/0188089 | A1* | 8/2006 | Diethorn | H04M 9/082 379/406.01 |
| 2009/0136020 | A1* | 5/2009 | Wang | H04B 3/234 379/406.01 |
| 2009/0225912 | A1* | 9/2009 | Shih | H04B 3/23 375/346 |
| 2019/0052311 | A1* | 2/2019 | Murugesu | H04L 27/367 |
| 2019/0123701 | A1* | 4/2019 | Wani | H03F 3/45968 |

\* cited by examiner

|   |   |   | ΔP | ΔQ | ΔR | ΔS |
|---|---|---|---|---|---|---|
| G16 | P16 | +ΔA+ΔB−···+ΔO+ΔP+ΔQ+ΔR+ΔS | ○ | ● | □ | ■ |
| G16 | P15 | +ΔA+ΔB−···+ΔO+ΔP+ΔQ+ΔR−ΔS | ○ | ● | □ |   |
| G16 | P14 | +ΔA+ΔB−···+ΔO+ΔP+ΔQ−ΔR+ΔS | ○ | ● |   | ■ |
| G16 | P13 | +ΔA+ΔB−···+ΔO+ΔP+ΔQ−ΔR−ΔS | ○ | ● |   |   |
| G16 | P12 | +ΔA+ΔB−···+ΔO+ΔP−ΔQ+ΔR+ΔS | ○ |   | □ | ■ |
| G16 | P11 | +ΔA+ΔB−···+ΔO+ΔP−ΔQ+ΔR−ΔS | ○ |   | □ |   |
| G16 | P10 | +ΔA+ΔB−···+ΔO+ΔP−ΔQ−ΔR+ΔS | ○ |   |   | ■ |
| G16 | P09 | +ΔA+ΔB−···+ΔO+ΔP−ΔQ−ΔR−ΔS | ○ |   |   |   |
| G16 | P08 | +ΔA+ΔB−···+ΔO−ΔP+ΔQ+ΔR+ΔS |   | ● | □ | ■ |
| G16 | P07 | +ΔA+ΔB−···+ΔO−ΔP+ΔQ+ΔR−ΔS |   | ● | □ |   |
| G16 | P06 | +ΔA+ΔB−···+ΔO−ΔP+ΔQ−ΔR+ΔS |   | ● |   | ■ |
| G16 | P05 | +ΔA+ΔB−···+ΔO−ΔP+ΔQ−ΔR−ΔS |   | ● |   |   |
| G16 | P04 | +ΔA+ΔB−···+ΔO−ΔP−ΔQ+ΔR+ΔS |   |   | □ | ■ |
| G16 | P03 | +ΔA+ΔB−···+ΔO−ΔP−ΔQ+ΔR−ΔS |   |   | □ |   |
| G16 | P02 | +ΔA+ΔB−···+ΔO−ΔP−ΔQ−ΔR+ΔS |   |   |   | ■ |
| G16 | P01 | +ΔA+ΔB−···+ΔO−ΔP−ΔQ−ΔR−ΔS |   |   |   |   |
| G01 | N16 | −ΔA−ΔB−...−ΔO+ΔP+ΔQ+ΔR+ΔS | ○ | ● | □ | ■ |
| G01 | N15 | −ΔA−ΔB−...−ΔO+ΔP+ΔQ+ΔR−ΔS | ○ | ● | □ |   |
| G01 | N14 | −ΔA−ΔB−...−ΔO+ΔP+ΔQ−ΔR+ΔS | ○ | ● |   | ■ |
| G01 | N13 | −ΔA−ΔB−...−ΔO+ΔP+ΔQ−ΔR−ΔS | ○ | ● |   |   |
| G01 | N12 | −ΔA−ΔB−...−ΔO+ΔP−ΔQ+ΔR+ΔS | ○ |   | □ | ■ |
| G01 | N11 | −ΔA−ΔB−...−ΔO+ΔP−ΔQ+ΔR−ΔS | ○ |   | □ |   |
| G01 | N10 | −ΔA−ΔB−...−ΔO+ΔP−ΔQ−ΔR+ΔS | ○ |   |   | ■ |
| G01 | N09 | −ΔA−ΔB−...−ΔO+ΔP−ΔQ−ΔR−ΔS | ○ |   |   |   |
| G01 | N08 | −ΔA−ΔB−...−ΔO−ΔP+ΔQ+ΔR+ΔS |   | ● | □ | ■ |
| G01 | N07 | −ΔA−ΔB−...−ΔO−ΔP+ΔQ+ΔR−ΔS |   | ● | □ |   |
| G01 | N06 | −ΔA−ΔB−...−ΔO−ΔP+ΔQ−ΔR+ΔS |   | ● |   | ■ |
| G01 | N05 | −ΔA−ΔB−...−ΔO−ΔP+ΔQ−ΔR−ΔS |   | ● |   |   |
| G01 | N04 | −ΔA−ΔB−...−ΔO−ΔP−ΔQ+ΔR+ΔS |   |   | □ | ■ |
| G01 | N03 | −ΔA−ΔB−...−ΔO−ΔP−ΔQ+ΔR−ΔS |   |   | □ |   |
| G01 | N02 | −ΔA−ΔB−...−ΔO−ΔP−ΔQ−ΔR+ΔS |   |   |   | ■ |
| G01 | N01 | −ΔA−ΔB−...−ΔO−ΔP−ΔQ−ΔR−ΔS |   |   |   |   |

Fig. 4

DIGITAL-TO-ANALOG CONVERSION APPARATUS AND METHOD HAVING SIGNAL CALIBRATION MECHANISM

BACKGROUND OF THE INVENTION

1. Field of the Invention

The present invention relates to a digital-to-analog conversion (DAC) apparatus and a digital-to-analog conversion method having signal calibration mechanism.

2. Description of Related Art

A DAC circuit is an important circuit component that converts a signal from a digital form to an analog form. Based on different digital codes, the DAC circuit can multiply the digital codes by a corresponding conversion gain value to generate analog signals with different intensities.

However, for a current-output type of DAC circuit, a manufacturing process offset results in non-ideal offsets of amplitude and shape of the outputted analog signal. The offset of amplitude especially affects the system performance seriously.

SUMMARY OF THE INVENTION

In consideration of the problem of the prior art, an object of the present invention is to supply a digital-to-analog conversion apparatus and a digital-to-analog conversion method having signal calibration mechanism.

The present invention discloses a digital-to-analog conversion (DAC) apparatus having signal calibration mechanism that includes a DAC circuit, an echo transmission circuit, a calibration circuit, an echo-canceling circuit and a calibration parameter calculating circuit. The DAC circuit includes a plurality of current sources each having a current offset, and is configured to control an operation state of each of the current sources to be one of a first current output state and a second current output state according to an input digital codeword included by an input digital signal, so as to generate an output analog signal according to a total current of the current sources, wherein each of the current sources outputs a current with a same current amount but opposite signs respectively under the first current output state and the second current output state. The echo transmission circuit processes the output analog signal to generate an echo signal. The calibration circuit receives the input digital signal and perform mapping from a codeword offset mapping table according to the input digital codeword to generate an offset, wherein the codeword offset mapping table includes a one-to-one correspondence relation between a plurality of codewords and a plurality of codeword offsets. The echo-canceling circuit processes the offset according to a group of echo-canceling coefficients to generate an echo-canceling signal. The calibration parameter calculating circuit is configured to generate an offset amount according to a difference between the echo signal and the echo-canceling signal, to categorize the offset amount corresponding to the different input digital codeword into a plurality of groups according to the operation state of each of the current sources to perform statistic operation, to set each of the current sources as a target current source to perform calculation among the groups such that the current offset of each of the current sources besides the target current source cancels out to calculate the current offset of the target current source and to convert the current offset of the current sources to the codeword offsets to update the codeword offsets in the codeword offset mapping table.

The present invention also discloses a digital-to-analog conversion method having signal calibration mechanism that includes the steps outlined below. An operation state of each of a plurality of current sources is controlled to be one of a first current output state and a second current output state, by a DAC circuit comprising the current sources each having a current offset, according to an input digital codeword included by an input digital signal, so as to generate an output analog signal according to a total current of the current sources, wherein each of the current sources outputs a current with a same current amount but opposite signs respectively under the first current output state and the second current output state. The output analog signal is processed to generate an echo signal by an echo transmission circuit. The input digital signal is received and mapping is performed from a codeword offset mapping table according to the input digital codeword by a calibration circuit to generate an offset, wherein the codeword offset mapping table includes a one-to-one correspondence relation between a plurality of codewords and a plurality of codeword offsets. The offset is processed according to a group of echo-canceling coefficients by an echo-canceling circuit to generate an echo-canceling signal. An offset amount is generated according to a difference between the echo signal and the echo-canceling signal by a calibration parameter calculating circuit. The offset amount corresponding to the different input digital codeword is categorized into a plurality of groups according to the operation state of each of the current sources to perform statistic operation by the calibration parameter calculating circuit. Each of the current sources is set as a target current source to perform calculation among the groups by the calibration parameter calculating circuit such that the current offset of each of the current sources besides the target current source cancels out to calculate the current offset of the target current source. The current offset of the current sources is converted to the codeword offsets to update the codeword offsets in the codeword offset mapping table by the calibration parameter calculating circuit.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 4 illustrates a more detailed diagram of the groups according to an embodiment of the present invention.

DETAILED DESCRIPTION OF THE PREFERRED EMBODIMENTS

An aspect of the present invention is to provide a digital-to-analog conversion apparatus and a digital-to-analog conversion method having signal calibration mechanism to perform calibration on the offset of each of different codewords to avoid the error caused by the offset of the output signal due to the offset of the codewords.

Figure 1:
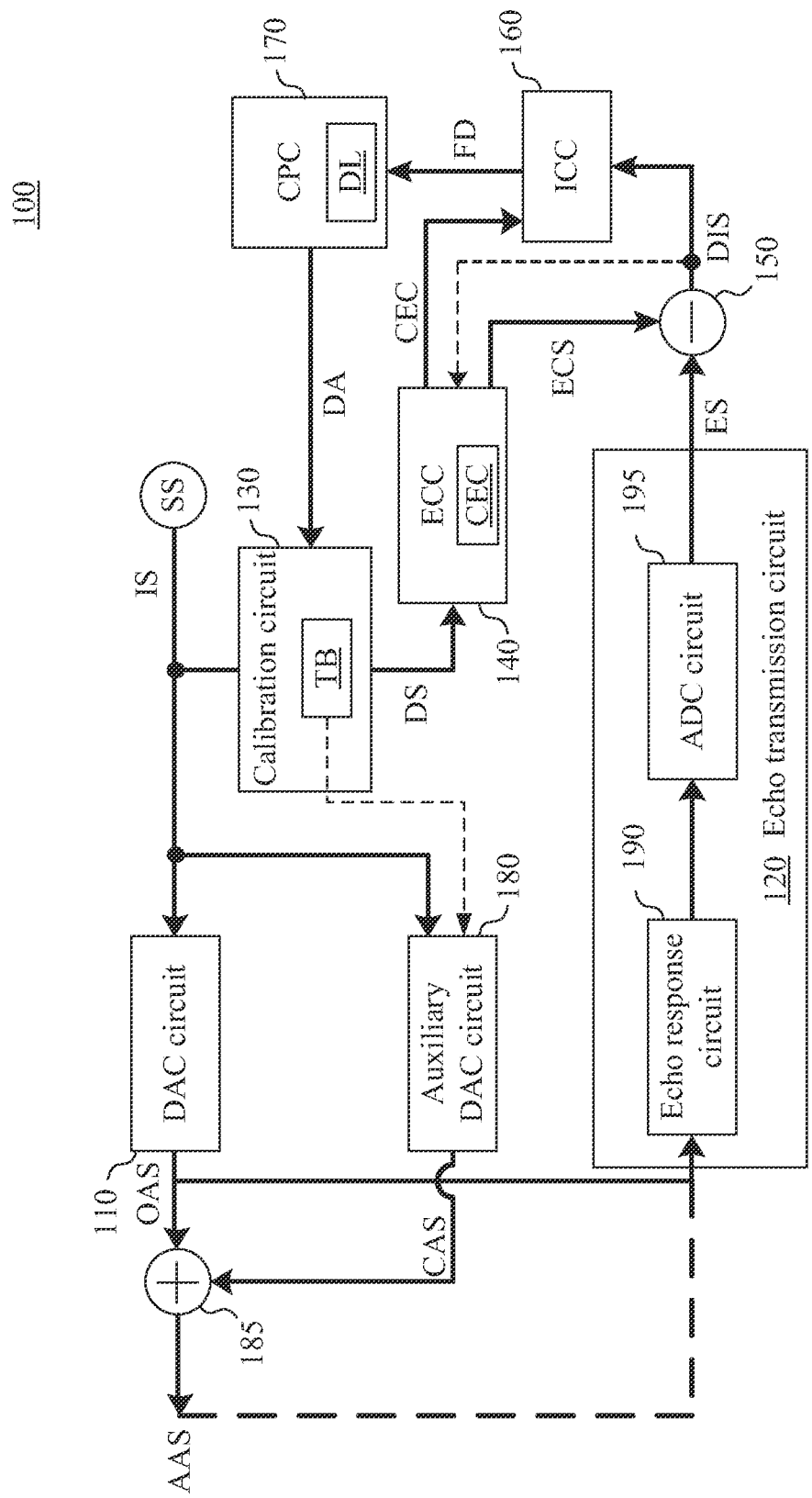
FIG. 1 illustrates a block diagram of a digital-to-analog conversion apparatus having signal calibration mechanism according to an embodiment of the present invention.

Reference is now made to FIG. 1. FIG. 1 illustrates a block diagram of a digital-to-analog conversion apparatus 100 having signal calibration mechanism according to an embodiment of the present invention. The digital-to-analog conversion apparatus 100 includes a DAC circuit 110, an echo transmission circuit 120, a calibration circuit 130, an echo-canceling circuit 140 (abbreviated as ECC in FIG. 1), an error calculating circuit 150, an inverted error calculating circuit 160 (abbreviated as ICC in FIG. 1), a calibration parameter calculating circuit 170 (abbreviated as CPC in FIG. 1) and an auxiliary DAC circuit 180.

The DAC circuit 110 receives an input digital signal IS including an input digital codeword from a signal source SS to perform digital-to-analog conversion to generate an output analog signal OAS. The signal source SS can be such as, but not limited to a transmission circuit (TX) of a communication system.

Figure 2:
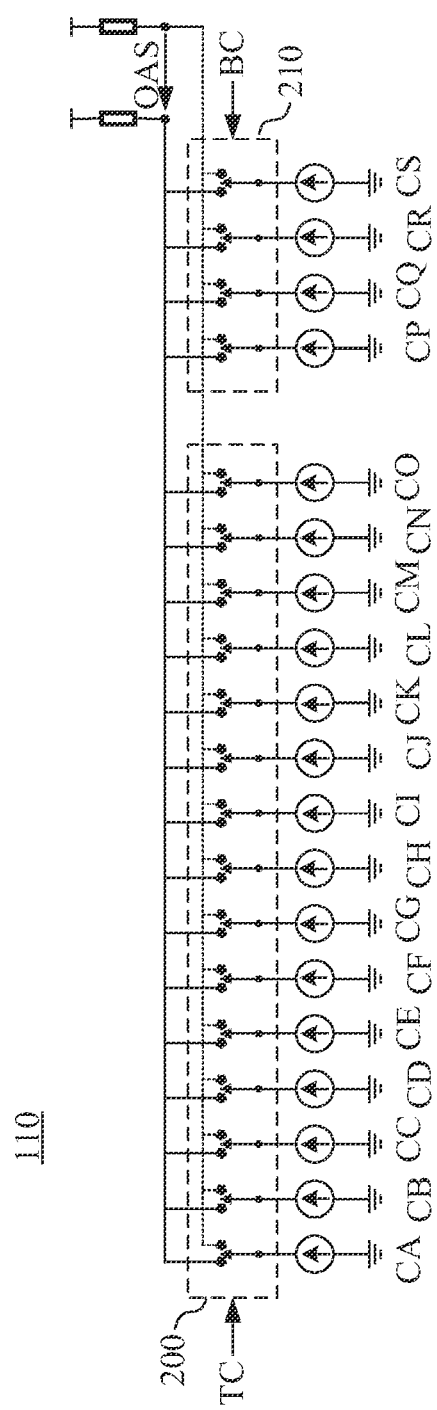
FIG. 2 illustrates a circuit diagram of the DAC circuit according to an embodiment of the present invention.

Reference is now made to FIG. 2 at the same time. FIG. 2 illustrates a circuit diagram of the DAC circuit 110 according to an embodiment of the present invention.

The DAC circuit 110 includes a plurality of current sources CA~CS. The input digital codeword of the input digital signal IS can control the operation state of each of the current sources CA~CS to be one of a first current output state and a second current output state, so as to generate the output analog signal OAS according to a total current of the current sources CA~CS. Each of the current sources CA~CS outputs a current with the same current amount but opposite signs respectively under the first current output state and the second current output state In an embodiment, the input digital codeword of the input digital signal IS includes a plurality of thermometer codes TC to control a plurality of thermometer-control current sources CA~CO of the current sources. Each of the current sources CA~CO outputs one unit of current. In an embodiment, the thermometer codes TC controls the switching circuit 200 corresponding to the current sources CA~CO such that the current sources CA~CO are electrically coupled to different current output paths through the switching circuit 200, e.g., one of the solid-line paths and the dotted-line paths illustrated in FIG. 2, so as to be operated in one of the first current output state and the second current output state.

The thermometer codes TC having a number of A have 2A code combinations that are able to control the thermometer-control current sources having a number of 2A-1. In the present embodiment, A is 4. As a result, 4 thermometer codes TC control 15 thermometer-control current sources CA~CO according to 16 combinations.

In operation, when the thermometer codes TC switch from the combinations of (0000), (0001), . . . to (1111) in order, the current sources CA~CO switches the operation state thereof in order like a thermometer. As a result, the operation of the current sources CA~CO starts from all being in the second current output state, through gradually switching the current sources CA to the current sources CN from the second current output state to the first current output state, to all being in the first current output state.

In an embodiment, the input digital codeword of the input digital signal IS includes a plurality of binary codes BC to control a plurality of binary-control current sources CP~CS of the current sources. The current sources CP~CS respectively output ½ unit, ¼ unit, ⅛ unit and 1/16 unit of current.

In an embodiment, the binary codes BC controls the switching circuit 210 corresponding to the current sources CP~CS such that the current sources CP~CS are electrically coupled to different current output paths through the switching circuit 210, such as one of the solid-line paths and the dotted-line paths illustrated in FIG. 2, so as to be operated in one of the first current output state and the second current output state.

The binary codes BC having a number of B have $2^B$ combinations that are able to control the binary-control current sources having a number of B. In the present embodiment, B is 4. As a result, 4 binary codes BC control 4 binary-control current sources CP~CS according to 16 combinations.

In operation, when the binary codes BC switch from the combinations of (0000), (0001), . . . to (1111) in order, the current source CP operates in the second current output state and the first current output state respectively when the highest bit is 0 and 1. The current source CQ operates in the second current output state and the first current output state respectively when the second highest bit is 0 and 1. The current source CR operates in the second current output state and the first current output state respectively when the second lowest bit is 0 and 1. The current source CS operates in the second current output state and the first current output state respectively when the lowest bit is 0 and 1.

As a result, the DAC circuit 110 can generate an output analog signal OAS according to the total current of the current sources CA~CS by using the thermometer codes TC to control the switching circuit 200 and using the binary codes BC to control the switching circuit 210.

Due to the manufacturing process offset, each of the current sources CA~CS has a current offset. The thermometer-control current sources having the number of $2^A$-1 generate $2^A$-1 combinations of current offsets. The binary-control current sources having the number of B generate B combinations of current offsets. All the current sources generate $2^A$-1+B combinations of current offsets.

According to different input digital codewords, these current offsets result in different codeword offsets. In the numerical example described above, 15 thermometer-control current sources and 4 binary-control current sources result in 19 combinations of current offsets. The 19 current sources are controlled by 256 combinations of the input digital codeword, wherein the input digital codeword has 8 bits (4 bits of thermometer codes and 4 bits of binary codes). As a result, 19 combinations of current offsets result in 256 combinations of codeword offsets.

The echo transmission circuit 120 processes the output analog signal OAS to generate an echo signal ES.

In an embodiment, the echo transmission circuit 120 includes an echo response circuit 190 and analog-to-digital conversion (ADC) circuit 195. The echo response circuit 190 performs an echo response processing on the output analog signal OAS and the analog-to-digital conversion circuit 195 performs analog-to-digital conversion subsequently to generate an echo signal ES. In an embodiment, the echo transmission circuit 120 may selectively include such as, but not limited to a low-pass filter or other digital signal processing circuit (not illustrated in the figure) to perform further digital processing on the echo signal ES.

The calibration circuit 130 receives the input digital signal IS and performs mapping from a codeword offset mapping table TB according to the input digital codeword of the input digital signal IS to generate an offset DS. The codeword offset mapping table TB includes a one-to-one correspondence relation between a plurality of codewords and a plurality of codeword offsets, and the input digital codeword corresponds to one of these codewords. Take the 8-bit form of codeword as an example, the codeword offset mapping table TB includes 256 correspondence relations such that each of the 256 codewords corresponds to one of the 256 offsets. In an embodiment, in an initial state, each of all the offsets that the codewords correspond to is preset to be 0.

The echo-canceling circuit 140 processes the offset DS according to a group of echo-canceling coefficients CEC to generate an echo-canceling signal ECS. It is appreciated that in an embodiment, the echo-canceling circuit 140 can be shared with the receiving circuit (RX) of the communication system to cancel the echo signal fed to the receiving circuit from the transmission circuit.

The calibration parameter calculating circuit 170 generates an offset amount DA according to a difference between the echo signal ES and the echo-canceling signal ECS. The echo signal ES and the echo-canceling signal ECS may be selectively processed by the error calculating circuit 150 and the inverted error calculating circuit 160 first and processed by the calibration parameter calculating circuit 170 subsequently.

The error calculating circuit 150 performs subtraction between the echo signal ES and the echo-canceling signal ECS to generate an error signal DIS. In an initial state, the echo-canceling circuit 140 performs training process on the echo-canceling coefficients CEC according to the error signal DIS such that the echo-canceling coefficients CEC converges and applies response processing on the offset DS according to the converged echo-canceling coefficients CEC. Such a response processing is identical to the response of a path including the DAC circuit 110 and the echo response circuit 190 that transmits the input digital signal IS from the signal source SS.

Subsequently, the inverted error calculating circuit 160 performs one-dimensional inversion on the echo-canceling coefficients CEC and respectively performs multiplication thereon by the value of the error signal DIS to generate an inverted error value FD. The calibration parameter calculating circuit 170 can make the inverted error value FD serve as the offset amount DA that the input digital codeword corresponds to according to a path delay amount DL of the echo-canceling circuit 140 and the inverted error calculating circuit 160.

It is appreciated that the generation of the offset amount described above is merely an example. In other embodiments, the calibration parameter calculating circuit 170 may generate the offset amount DA by using other methods.

Further, the calibration parameter calculating circuit 170 categorizes the offset amount DA corresponding to the different input digital codeword into a plurality of groups according to the operation state of each of the current sources CA~CO to perform statistic operation. More specifically, the calibration parameter calculating circuit 170 categorizes the offset amount DA corresponding to the different input digital codeword into one of the groups that corresponds to a combination of the thermometer codes, and generates an average value of the offset amount DA of each of the groups. The groups are arranged in an order such that for each two of the neighboring groups, the operation state of one of the thermometer-control current sources is at the first current output state and the second current output state respectively.

Figure 3:
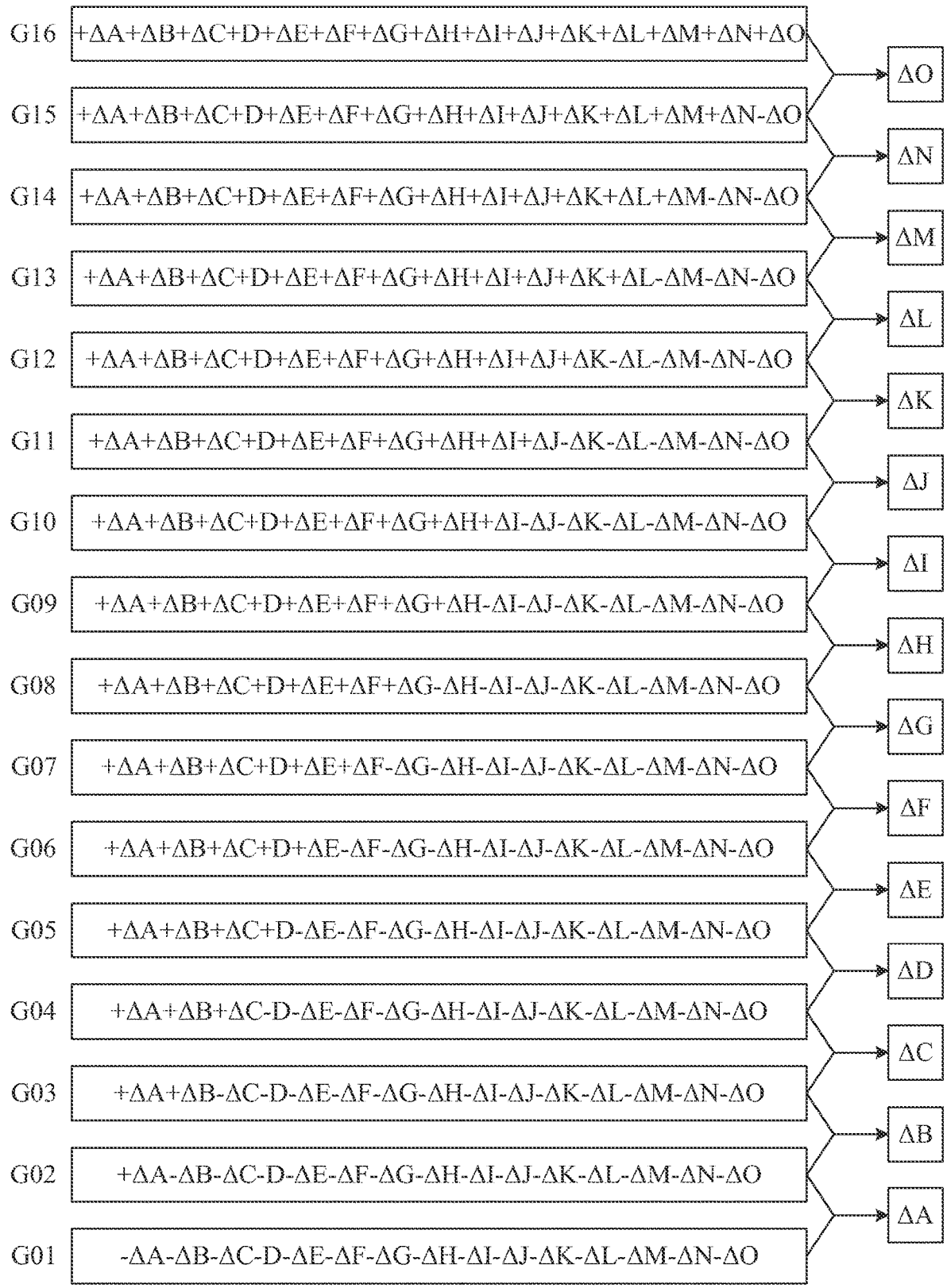
FIG. 3 illustrates a diagram of the groups that categorize the offset amount according to the operation state of each of the current sources according to an embodiment of the present invention.

Reference is now made to FIG. 3. FIG. 3 illustrates a diagram of the groups G01~G16 that categorize the offset amount DA according to the operation state of each of the current sources CA~CO according to an embodiment of the present invention.

In an embodiment, the current offsets of the current sources CAC are Δ A~ΔO. When the current sources CA~CO are under the first current output state, the current offsets are +ΔA~+ΔO. When the current sources CA~CO are under the second current output state, the current offsets are −ΔA~−ΔO.

The group G01 corresponds to the thermometer code (0000) that makes the current sources CA~CO all operate under the second current output state while the binary codes can be any values (0000~1111). As a result, 16 input digital codewords (00000000~00001111) belong to the group G01. After a certain amount of offset amounts DA categorized into the group G01 are averaged, the current offset of the current sources CP~CS (the binary-control current sources) cancel out each other such that the average value approximates a sum of the current offset of the current sources CA~CO, which is −ΔA−ΔB−ΔC− . . . −ΔO.

Identically, the average value of each of the group G02 to the group G16 that corresponds the each of the thermometer codes (0001~1111) can be obtained by using the derivative method described above. The detail is not described herein.

The calibration parameter calculating circuit 170 sets each of the current sources CA~CO as a target current source to perform calculation among the groups G01~G16 such that the current offset of each of the current sources besides the target current source cancels out to calculate the current offset of the target current source.

More specifically, the calibration parameter calculating circuit 170 generates one of the current offsets of the thermometer-control current sources according to a difference of the average values of each two of the neighboring groups. For example, the difference of the average values between the group G02 and the group G01 can be expressed by the following equation:

$$(+\Delta A - \Delta B - \Delta C - \ldots - \Delta O) - (-\Delta A - \Delta B - \Delta C - \ldots - \Delta O) = +2\Delta A$$

As a result, the calibration parameter calculating circuit 170 can generate the current offset ΔA of the current source CA by using the calculation described above.

Identically, the calibration parameter calculating circuit 170 can generate the current offsets ΔB~ΔO each corresponding to one of the current sources CB~CO according to the differences of the average values between the groups G03 and G02, between the groups G04 and G03, . . . and between the groups G16 and G15.

In an embodiment, the calibration parameter calculating circuit 170 sets the average value of each of the group G01 and the group G16 to be 0 as anchor points, and generates the current offset of one of the thermometer-control current sources according to a difference between the average values of each two of the neighboring groups. The interaction within the system can thus be avoided.

Reference is now made to FIG. 4. FIG. 4 illustrates a more detailed diagram of the group G01 and the group G16 according to an embodiment of the present invention.

Besides the current offsets of the thermometer-control current sources, the offset amounts DA categorized into each of the groups also include the 16 combinations of the current offsets of the binary-control current source.

Take group G01 and the group G16 as an example, the current offsets of the current sources CP~CS that are the binary-control current sources are ΔP~+ΔS. When the current sources CP~CS are under the first current output state, the current offsets are +ΔP~+ΔS. When the current sources CP~CS are under the second current output state, the current offsets are −ΔP~−ΔS. As a result, according to the operation state of the each of the current sources CP~CS, the current offset of each of the groups has 16 combination illustrated in FIG. 4. In FIG. 4, the 16 combinations corresponding to the group G01 are labeled as P01~P16 respectively. The 16 combinations corresponding to the group G16 are labeled as N01~N16 respectively.

The calibration parameter calculating circuit 170 selects a first group and a second group from the groups G01~G16, wherein the thermometer codes corresponding to the first group and the second group make the operation state of each of the thermometer-control current sources completely opposite. Further, the calibration parameter calculating circuit 170 averages the offset amount DA of each of the binary-control current sources that corresponds to the first current output state in the first group and the second group to generate the current offset of one of the binary-control current sources.

Take the group G01 and the group G16 as an example, the thermometer code corresponding to the group G01 (0000) makes all the current sources CA~CO operate under the second current output state. The thermometer code corresponding to the group G16 (1111) makes all the current sources CA~CO operate under the first current output state.

Take the current source CP as an example, the calibration parameter calculating circuit 170 categorizes the offset amounts DA that make the current source CP operate under the first current output state and perform average thereon. As illustrated in FIG. 4, the offset amounts DA that make the current source CP operate under the first current output state corresponding to the combinations N09~N16 and P09~P16 and are marked with white dots. After averaging these offset amounts DA, the current offsets ΔQ~ΔS in these combinations cancel out such that only the current offset ΔP of the current source CP remains.

The current offsets ΔQ~ΔS can be generated by using the same method. For example, the current offset ΔQ can be generated by performing averaging on the combinations marked with black dots. The current offset ΔR can be generated by performing averaging on the combinations marked with white grids. The current offset ΔS can be generated by performing averaging on the combinations marked with black grids. The detail calculation is not described herein. It is appreciated that the selection of the group G01 and the group G16 is merely an example. In other embodiments, the calibration parameter calculating circuit 170 may select other two groups having the thermometer-control current sources operate in completely opposite states.

The calibration parameter calculating circuit 170 converts the current offsets ΔA~ΔS to the codeword offsets to update the codeword offsets in the codeword offset mapping table TB in FIG. 1. In an embodiment, the calibration parameter calculating circuit 170 can accumulate more pieces of the offset amounts DA within every certain time interval to further perform calculation of the current offsets so as to update the codeword offset mapping table TB.

After the codeword offsets are updated to a stable condition, the auxiliary DAC circuit 180 receives the input digital signal IS and performs mapping from the codeword offset mapping table TB according to the input digital codeword to generate an offset calibration analog signal CAS. The absolute value of the offset calibration analog signal CAS is equivalent to the absolute value of the offset that the input digital codeword corresponds to. The digital-to-analog conversion apparatus 100 may further includes an adding circuit 185 to add the offset calibration analog signal CAS and the output analog signal OAS to cancel the offset that the input digital codeword corresponds to and generate an actual output analog signal AAS.

It is appreciated that the offset may be a positive value or a negative value. When the offset is a positive value, the offset calibration analog signal CAS is a negative value. When the offset is a negative value, the offset calibration analog signal CAS is a positive value.

As a result, the digital-to-analog conversion apparatus of the present invention performs calculation of the current offsets and converts the current offsets to the offsets of the codewords to perform calibration on the offsets of different codewords, in which the number of the current offsets is less than the number of the codewords. Not only the offset of the signal can be calibrated, the mass calculation amount that is required to directly calculate the codeword offsets can be avoided.

Figure 5:
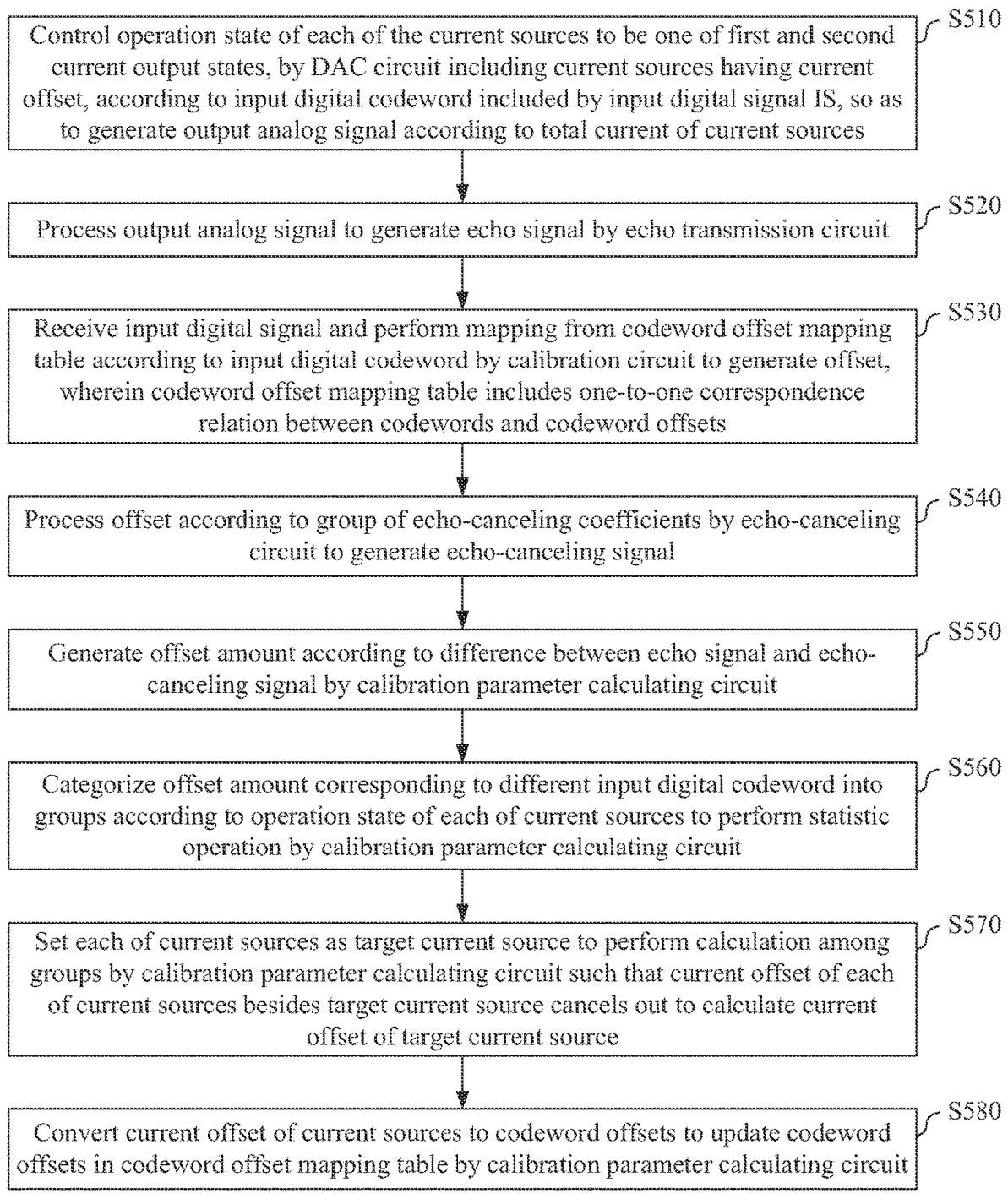
FIG. 5 illustrates a flow chart of a digital-to-analog conversion method having signal calibration mechanism according to an embodiment of the present invention.

Reference is now made to FIG. 5. FIG. 5 illustrates a flow chart of a digital-to-analog conversion method 500 having signal calibration mechanism according to an embodiment of the present invention.

In addition to the apparatus described above, the present disclosure further provides the digital-to-analog conversion method 500 that can be used in such as, but not limited to, the digital-to-analog conversion apparatus 100 in FIG. 1. As illustrated in FIG. 5, an embodiment of the digital-to-analog conversion method 500 includes the following steps.

In step S510, the operation state of each of the current sources CA~CS is controlled to be one of the first current output state and the second current output state, by the DAC circuit 110 including the current sources CA~CS each having a current offset, according to an input digital codeword included by an input digital signal IS, so as to generate the output analog signal OAS according to the total current of the current sources CA~CS, wherein each of the current sources CA~CS outputs the current with the same current amount but opposite signs respectively under the first current output state and the second current output state.

In step S520, the output analog signal OAS is processed to generate the echo signal ES by the echo transmission circuit 120.

In step S530, the input digital signal IS is received and mapping is performed from the codeword offset mapping table TB according to the input digital codeword by the calibration circuit 130 to generate the offset DS, wherein the codeword offset mapping table TB includes the one-to-one correspondence relation between the codewords and the codeword offsets.

In step S540, the offset DS is processed according to the group of echo-canceling coefficients CEC by the echo-canceling circuit 140 to generate the echo-canceling signal ECS.

In step S550, the offset amount DA is generated according to the difference between the echo signal ES and the echo-canceling signal ECS by the calibration parameter calculating circuit 170.

In step S560, the offset amount DA corresponding to the different input digital codeword is categorized into the groups according to the operation state of each of the current sources CA~CS to perform statistic operation by the calibration parameter calculating circuit 170.

In step S570, each of the current sources CA~CS is set as the target current source to perform calculation among the groups by the calibration parameter calculating circuit 170 such that the current offset of each of the current sources CA~CS besides the target current source cancels out to calculate the current offset of the target current source.

In step S580, the current offset of the current sources CA~CS is converted to the codeword offsets to update the codeword offsets in the codeword offset mapping table TB by the calibration parameter calculating circuit 170.

It is appreciated that the embodiments described above are merely an example. In other embodiments, it should be appreciated that many modifications and changes may be made by those of ordinary skill in the art without departing, from the spirit of the disclosure.

In summary, the present invention discloses the digital-to-analog conversion apparatus and the digital-to-analog conversion method having signal calibration mechanism that performs calculation of the current offsets and converts the current offsets to the offsets of the codewords to perform calibration on the offsets of different codewords, in which the number of the current offsets is less than the number of the codewords. Not only the offset of the signal can be calibrated, the mass calculation amount that is required to directly calculate the codeword offsets can be avoided.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A digital-to-analog conversion (DAC) apparatus having signal calibration mechanism, comprising:
    a DAC circuit comprising a plurality of current sources each having a current offset, and configured to control an operation state of each of the current sources to be one of a first current output state and a second current output state according to an input digital codeword comprised by an input digital signal, so as to generate an output analog signal according to a total current of the current sources, wherein each of the current sources outputs a current with a same current amount but opposite signs respectively under the first current output state and the second current output state;
    an echo transmission circuit to process the output analog signal to generate an echo signal;
    a calibration circuit to receive the input digital signal and perform mapping from a codeword offset mapping table according to the input digital codeword to generate an offset, wherein the codeword offset mapping table comprises a one-to-one correspondence relation between a plurality of codewords and a plurality of codeword offsets;
    an echo-canceling circuit to process the offset according to a group of echo-canceling coefficients to generate an echo-canceling signal; and
    a calibration parameter calculating circuit configured to:
        generate an offset amount according to a difference between the echo signal and the echo-canceling signal;
        categorize the offset amount corresponding to the different input digital codeword into a plurality of groups according to the operation state of each of the current sources to perform statistic operation;
        set each of the current sources as a target current source to perform calculation among the groups such that the current offset of each of the current sources besides the target current source cancels out to calculate the current offset of the target current source; and
        convert the current offset of the current sources to the codeword offsets to update the codeword offsets in the codeword offset mapping table.

2. The digital-to-analog conversion apparatus of claim 1, further comprising an auxiliary DAC circuit to receive the input digital signal and perform mapping from the codeword offset mapping table according to the input digital codeword to generate an offset calibration analog signal, such that the offset calibration analog signal and the output analog signal are added to cancel the codeword offsets that the input digital codeword corresponds to output an actual output analog signal.

3. The digital-to-analog conversion apparatus in claim 1, wherein the input digital codeword comprises a plurality of thermometer codes to control a plurality of thermometer-control current sources of the current sources, the calibration parameter calculating circuit is further configured to:
    categorize the offset amount corresponding to the different input digital codeword into one of the groups that corresponds to a combination of the thermometer codes and generate an average value of the offset amount of each of the groups, wherein the groups are arranged in an order such that for each two of the neighboring groups, the operation state of one of the thermometer-control current sources is at the first current output state and the second current output state respectively; and
    generate the current offset of one of the thermometer-control current sources according to a difference of the average value between each two of the neighboring groups.

4. The digital-to-analog conversion apparatus in claim 3, wherein the input digital codeword further comprises a plurality of binary codes to control a plurality of binary-control current sources of the current sources, the calibration parameter calculating circuit is further configured to:
    select a first group and a second group from the groups, wherein the thermometer codes corresponding to the first group and the second group make the operation state of each of the thermometer-control current sources completely opposite; and
    average the offset amount of each of the binary-control current sources that corresponds to the first current output state in the first group and the second group to generate the current offset of one of the binary-control current sources.

5. The digital-to-analog conversion apparatus in claim 4, wherein a number of the thermometer codes is A, the number of the thermometer-control current sources is $2^A-1$, the number of the groups is $2^A$, the number of the binary codes is B, the number of the binary-control current sources is B, and the number of the combination of the offset amount comprised in each of the groups is $2^B$, and the number of the current offsets is $2^A-1+B$.

6. The digital-to-analog conversion apparatus in claim 4, wherein the calibration parameter calculating circuit sets the average value of each of the first group and the second group to be 0, and generates the current offset of one of the thermometer-control current sources according to a difference between the average values of each two of the neighboring groups.

7. A digital-to-analog conversion method having signal calibration mechanism, comprising:
    controlling an operation state of each of a plurality of current sources to be one of a first current output state and a second current output state, by a digital-to-analog conversion (DAC) circuit comprising the current sources each having a current offset, according to an input digital codeword comprised by an input digital signal, so as to generate an output analog signal according to a total current of the current sources, wherein each of the current sources outputs a current with a same current amount but opposite signs respectively under the first current output state and the second current output state;

processing the output analog signal to generate an echo signal by an echo transmission circuit;

receiving the input digital signal and performing mapping from a codeword offset mapping table according to the input digital codeword by a calibration circuit to generate an offset, wherein the codeword offset mapping table comprises a one-to-one correspondence relation between a plurality of codewords and a plurality of codeword offsets;

processing the offset according to a group of echo-canceling coefficients by an echo-canceling circuit to generate an echo-canceling signal;

generating an offset amount according to a difference between the echo signal and the echo-canceling signal by a calibration parameter calculating circuit;

categorizing the offset amount corresponding to the different input digital codeword into a plurality of groups according to the operation state of each of the current sources to perform statistic operation by the calibration parameter calculating circuit;

setting each of the current sources as a target current source to perform calculation among the groups by the calibration parameter calculating circuit such that the current offset of each of the current sources besides the target current source cancels out to calculate the current offset of the target current source; and converting the current offset of the current sources to the codeword offsets to update the codeword offsets in the codeword offset mapping table by the calibration parameter calculating circuit.

8. The digital-to-analog conversion method in claim 7, further comprising:

receiving the input digital signal and performing mapping from the codeword offset mapping table according to the input digital codeword by an auxiliary DAC circuit to generate an offset calibration analog signal, such that the offset calibration analog signal and the output analog signal are added to cancel the codeword offsets that the input digital codeword corresponds to output an actual output analog signal.

9. The digital-to-analog conversion method in claim 7, wherein the input digital codeword comprises a plurality of thermometer codes to control a plurality of thermometer-control current sources of the current sources, the digital-to-analog conversion method further comprises:

categorizing the offset amount corresponding to the different input digital codeword into one of the groups that corresponds to a combination of the thermometer codes and generating an average value of the offset amount of each of the groups by the calibration parameter calculating circuit, wherein the groups are arranged in an order such that for each two of the neighboring groups, the operation state of one of the thermometer-control current sources is at the first current output state and the second current output state respectively; and generating the current offset of one of the thermometer-control current sources according to a difference of the average value between each two of the neighboring groups by the calibration parameter calculating circuit.

10. The digital-to-analog conversion method in claim 9, wherein the input digital codeword further comprises a plurality of binary codes to control a plurality of binary-control current sources of the current sources, the digital-to-analog conversion method further comprises:

selecting a first group and a second group from the groups by the calibration parameter calculating circuit, wherein the thermometer codes corresponding to the first group and the second group make the operation state of each of the thermometer-control current sources completely opposite; and averaging the offset amount of each of the binary-control current sources that corresponds to the first current output state in the first group and the second group by the calibration parameter calculating circuit to generate the current offset of one of the binary-control current sources.

11. The digital-to-analog conversion method in claim 10, wherein a number of the thermometer codes is A, the number of the thermometer-control current sources is $2^A-1$, the number of the groups is $2^A$, the number of the binary codes is B, the number of the binary-control current sources is B, and the number of the combination of the offset amount comprised in each of the groups is $2^B$, and the number of the current offsets is $2^A-1+B$.

12. The digital-to-analog conversion method in claim 10, further comprising:

setting the average value of each of the first group and the second group to be 0, and generating the current offset of one of the thermometer-control current sources according to a difference between the average values of each two of the neighboring groups by the calibration parameter calculating circuit.

* * * * *